United States Patent [19]

Gdula

[11] Patent Number: 4,649,511
[45] Date of Patent: Mar. 10, 1987

[54] DYNAMIC MEMORY CONTROLLER FOR SINGLE-CHIP MICROPROCESSOR

[75] Inventor: Michael Gdula, Knox, N.Y.

[73] Assignee: General Electric Company, Schenectady, N.Y.

[21] Appl. No.: 516,620

[22] Filed: Jul. 25, 1983

[51] Int. Cl.⁴ .............................................. G06F 12/00
[52] U.S. Cl. .................................. 364/900; 365/222; 365/233
[58] Field of Search .............................. 365/222, 233; 364/200 MS File

[56] References Cited

U.S. PATENT DOCUMENTS

| | | | |
|---|---|---|---|
| 4,153,933 | 5/1979 | Blume, Jr. | 364/200 |
| 4,249,247 | 2/1981 | Patel | 364/900 |
| 4,328,566 | 5/1982 | Thaler | 365/222 |

*Primary Examiner*—James D. Thomas
*Assistant Examiner*—Emily Yue Chan

*Attorney, Agent, or Firm*—Geoffrey H. Krauss; James C. Davis, Jr.; Marvin Snyder

[57] ABSTRACT

A controller for interfacing a single-chip microcomputer with external dynamic random-access memory, includes a subcircuit for generating a column-address strobe at a time after a row-address strobe is generated, and also includes a multiplexing subcircuit for providing the proper 8-bit portion of a 16-bit address output from the microprocessor to the 8-bit dynamic memory inputs, prior to receipt of the associated row-address or column-address strobe. The microprocessor utilizes the strobe-generation and multiplexing subcircuits to burst-refresh the dynamic memory, in one presently preferred embodiment. In another presently preferred embodiment, lines from an additional microprocessor output port are utilized with a resettable binary counter and a multiplicity of buffers, to count through the range of row addresses in cyclic fashion, with each address being incremented after the previously-addressed row of memory cells has been refreshed.

15 Claims, 19 Drawing Figures

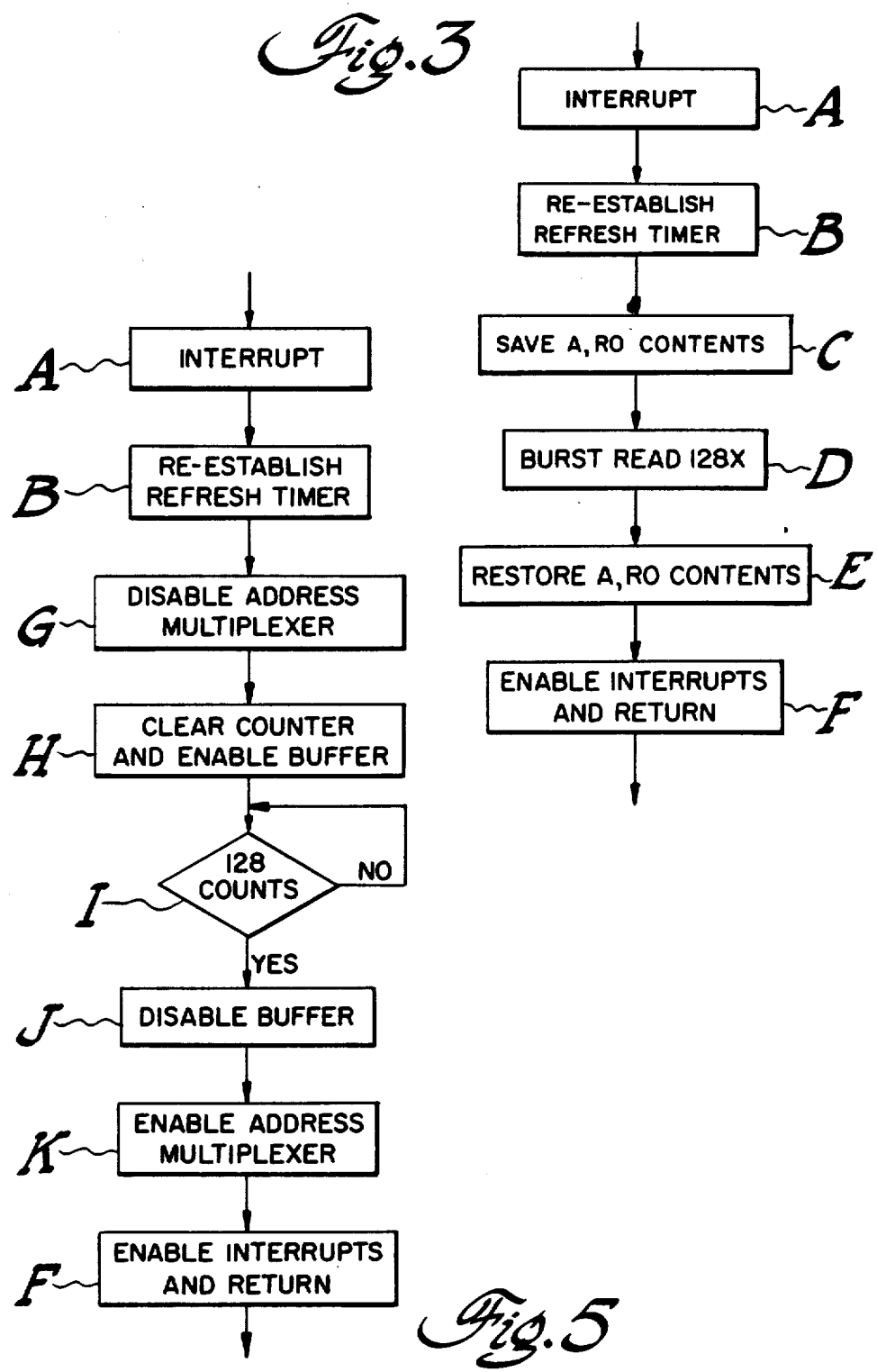

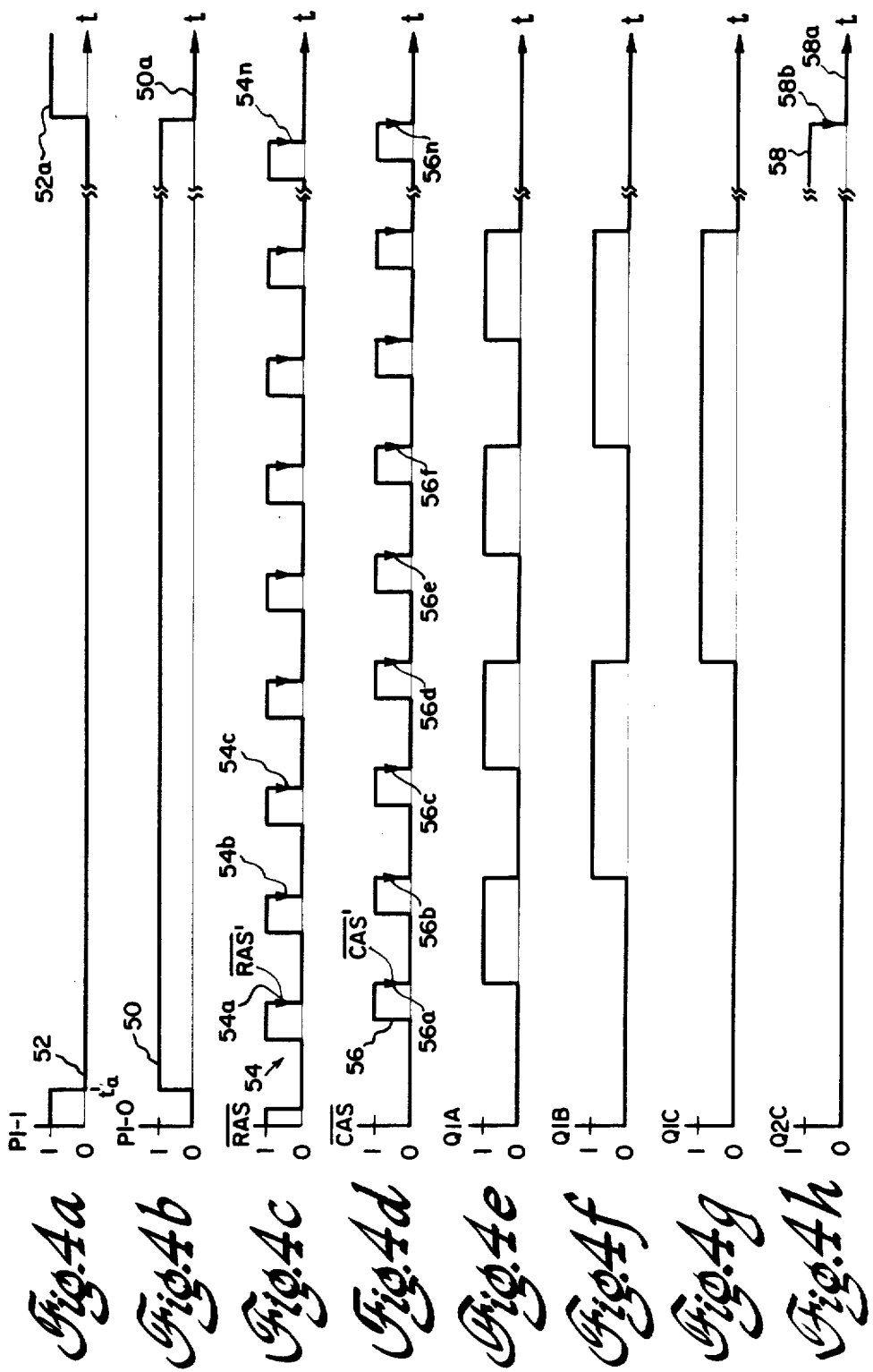

DYNAMIC MEMORY CONTROLLER FOR SINGLE-CHIP MICROPROCESSOR

BACKGROUND OF THE INVENTION

The present invention concerns dynamic memory control devices and, more particularly, a dynamic memory controller for use with single-chip microprocessors.

A single-chip microprocessor, having a central processing unit (CPU) and program-storing read-only memory (ROM) in addition to some amount of random-addressable memory (RAM), has been used for many applications. However, the amount of memory, whether of ROM or RAM type, contained in a typical single-chip microprocessor is often insufficient for the task to be handled. It is therefore often necessary to add additional external memory, particularly of the RAM type, which can at least temporarily store additional data for, and under the control of, the associated microprocessor. While static external memory is useable, it is often desired to use dynamic memory external to the single-chip microprocessor. The dynamic memory integrated circuits currently available are among the least expensive types of memory in use at this time, allowing overall system costs to be reduced by their use. Dynamic memory integrated circuits also consume less power than static memory devices, and thus reduce the cost of associated power supplies and cooling equipment. However, dynamic memories, which store charge in each internal memory cell as representative of the data element stored therein, require that the cell charge, which itself decays over time, be periodically refreshed to maintain the proper data state. This refresh operation is relatively critical in both the timing and the event sequencing requirements thereof. Further, when dynamic RAM memories are interfaced to microprocessor-based systems, additional system problems concerning connection of the microprocessor to the memory subsystem and reliable data transfer between the memory-subsystem and the microprocessor must be considered, in addition to the proper refresh operation.

It is known that a custom refresh controller can be provided by interconnection of a relatively large number of discrete logic devices. It is also known that a custom refresh controller can be implemented in large scale integration (LSI)circuit form, to provide a single integrated circuit package design. Such LSI packages are commercially available, as in the Intel 8202 or 8203 dynamic memory controller. However, these controllers are not adaptable for use with single-chip microcomputer designs. Further, even if these custom refresh controllers could be adapted to such a design, the cost of a dedicated memory controller is relatively expensive, as the controllers are relatively complex devices, and in some cases the custom controller may cost more than the memory devices themselves.

Accordingly, it is desirable to provide a circuit for interfacing dynamic RAM memory devices to a single-chip microprocessor in a relatively low-cost and performance-effective manner satisfying all of the timing and event sequencing criteria for the refresh cycle of the RAM used.

BRIEF SUMMARY OF THE INVENTION

In accordance with the invention, my novel dynamic memory controller is utilized with a microprocessor, typically of the single-chip type, having an external dynamic random-access RAM memory. A strobe-generating means provides a column-address strobe signal after providing a row-address strobe signal, to allow normal read/write operation of the external dynamic RAM memory, in conjunction with multiplexing means for selecting the proper one of a low-order byte or a high-order byte (from a 16-bit-wide address port of the microprocessor) for presentation to an 8-bit-wide address port of the external RAM memory. The microprocessor contains a timing register which is reset to provide an interrupt on a cyclic basis, with each interrupt establishing a refresh cycle of the external dynamic memory. The interrupt causes the microprocessor to carry out a predetermined sequence, sequentially accessing each row of memory cells and refreshing the charge therein.

In a first presently preferred embodiment, the microprocessor sequence temporarily stores the contents of and clears an internal accumulator register and an internal storage register and then executes a sequence of "dummy read" operations, wherein each row of the external memory is refreshed by reading the contents of any one cell thereon into the microprocessor accumulator register, but without the microprocessor utilizing the data read thereto. After burst dummy readings of all rows, the accumulator and register contents are restored and the microprocessor operation returns to normal.

In a second presently preferred embodiment, an additional binary counter and gateable buffer array are utilized with output lines from an additional port of the microprocessor. At the commencement of a refresh cycle, as determined by the timing register, the row addresses in the counter are cyclically incremented through the entire range of external memory cell row numbers, by that column-address strobe appearing after a particular row-address strobe covering all cells along a previously-counted row number to be refreshed. At the completion of counting, the microprocessor external interrupt is enabled and the microprocessor returns to its normal tasks, without ever having to shift data from the non-timing registers therein.

Accordingly, it is an object of the present invention to provide a novel circuit for controlling and refreshing dynamic memory and utilizable in conjunction with a single-chip microprocessor.

This and other objects of the present invention will become apparent upon consideration of the following detailed description, when read in conjunction with the drawings.

BRIEF SUMMAFY OF THE DRAWINGS

Figure 1:
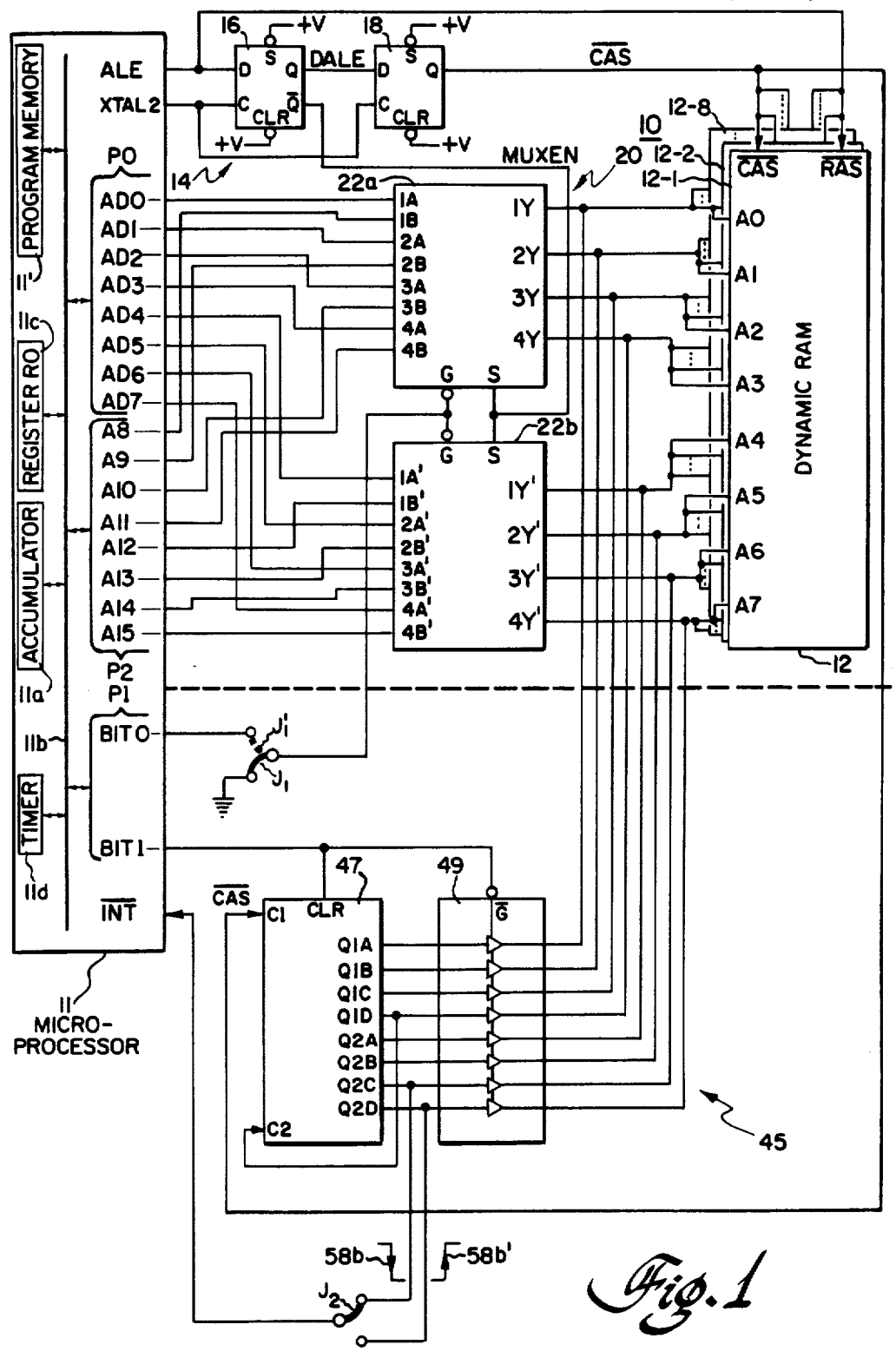
FIG. 1 is a schematic block diagram of a single-chip microprocessor, dynamic RAM memory for use therewith, and of presently-preferred embodiments of a dynamic memory controller in accordance with the principles of the present invention.

FIG. 3, consisting of A–F, is a program flow chart illustrating the dynamic memory controller subroutine carried out in the microprocessor of FIG. 1 for a memory refresh operation; and FIGS. 4a–4h are another set of time-coordinated waveforms useful in understanding operation of the second presently-preferred embodiment of the circuit of FIG. 1; and FIG. 5 is a program flow chart illustrating another dynamic memory controller subroutine for a memory refresh operation with a second presently-preferred controller embodiment.

DETAILED DESCRIPTION OF THE INVENTION

Referring initially to FIG. 1, a first presently-preferred embodiment of my novel dynamic memory controller 10 is utilized with a microprocessor 11, which may be of the single-chip type, such as the Intel 8051 single-chip microprocessor and the like. Controller 10 serves to interface microprocessor 11 to external dynamic RAM memory 12.

Figure 2A:
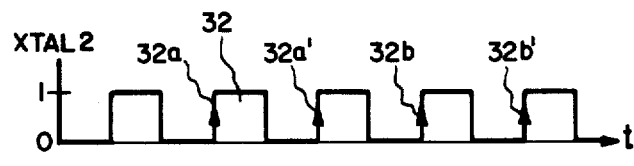
FIGS. 2a–2h are a set of time-coordinated signal waveforms, as occur in the first presently-preferred embodiment of the circuit of FIG. 1, and useful in understanding principles of operation thereof.
Figure 2B:
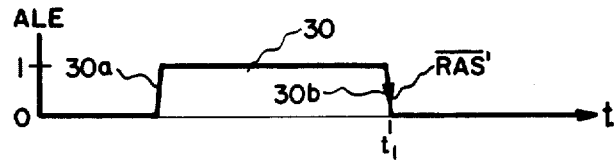

Microprocessor 11 typically generates a high-frequency clock signal utilizing internal circuitry and provides at least one terminal, such as terminal XTAL 2, at which the internal clock waveform signal (see FIG. 2a) is available. Microprocessor 11 also provides at least one terminal at which an external address latch enable strobe ALE signal (see FIG. 2b) is also made available external to the microprocessor. The microprocessor has an internal bus structure 11b, interconnecting internal program-storing memory 11' (which may include ROM and/or RAM) and the various ones of an accumulator register 11a, a storage RO register 11c and a programmable timer register 11d. The bus 11a also connects to a plurality of output lines and/or input/output lines for inputting and/or outputting data and/or address bits from the microprocessor. In the exemplary 8051 single-chip microprocessor, a first set of 8 lines AD0–AD7, hereinafter referred to as port 0 (P0), provides an 8-bit (1 byte) wide parallel port from which address or data information can flow or be received in this 8-bit-data machine. However, the microprocessor is capable of addressing up to 64K bytes of external memory 12, using a 16-bit-wide address word; the additional address bits are provided in parallel on lines A8–A15 forming a 1-byte-wide port 2 (P2). The particular microprocessor illustrated also has another 8-bit-wide port (port P1) with only the first and second lines, i.e. the BIT 0 and BIT 1 lines, being shown. The microprocessor also provides an interrupt INT input, at which input a falling voltage signal edge will cause an internal interrupt sequence to be initiated, if the INT input is internally enabled (typically under programmable control).

Dynamic RAM memory 12 can be comprised of one or more dynamic memory integrated circuits, such as the Fujitsu MB8264, Intel 2164 and the like. For the purposes of illustration only, dynamic memory 12 can be 8 RAM integrated circuits 12-1 through 12-8, each configured as a 64K bit (i.e. 65,536×1 bit) integrated circuit memory, having at least their $\overline{CAS}$, $\overline{RAS}$ and address A0–A7 lines connected in parallel, to realize a 65,536×8 bit external dynamic RAM for an 8-bit-wide data microcomputer. Each dynamic memory integrated circuit, being capable of storing 64K bits of information, requires 16 address lines to select that one of $2^{16}$ bits stored therein. As is well known in the art, each memory integrated circuit is internally configured with a matrix of 8 rows by 8 columns of data storage sites, whereby only 8 address-select input lines A0–A7 are required. The presence of a low logic signal at one of a column address-select $\overline{CAS}$ input or at a row-address-select $\overline{RAS}$ input determines whether the 8 address bits then present at inputs A0–A7 select a particular column or a particular row, to allow access to one of the storage cells. It should be understood that dynamic RAM 12 (and each integrated circuit thereof) includes other inputs and outputs for reading data into, and writing data out of, the memory, and that these additional terminals (not shown) are connected to other inputs and outputs (also not shown) of microprocessor 11. The interconnection of the actual lines for providing (reading) into and for obtaining (writing) data out of dynamic memory 12 is separate from my present invention, as, even though some portion of the memory may be refreshed during normal data read and write cycles, there is no way to guarantee that a normal data read or data write cycle will occur within each memory refresh period, typically about 2 milliseconds, because microprocessor 11 may be busy with other tasks, which do not require accessing the external dynamic memory. The circuitry for providing the proper one of the pair of 8-bit-wide address bytes to address lines A0–A7 and the associated row and column-address strobes for entering these half-address bytes for properly addressing the external dynamic RAM is, however, part of my novel circuit.

Figure 2C:
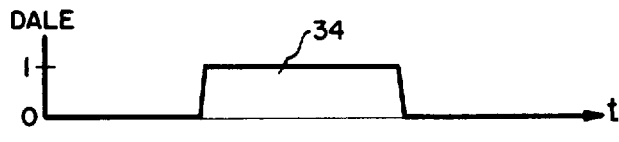
Figure 2D:
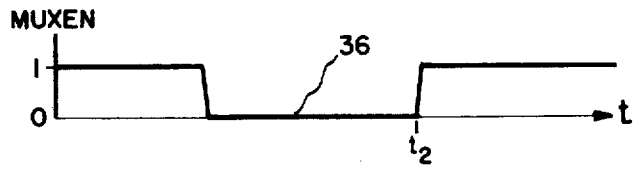
Figure 2E:
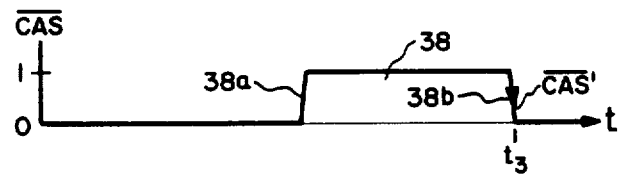

Dynamic memory controller 10 includes a row/column strobe generating means 14 for generating the row address strobe $\overline{RAS}$ signal for the dynamic memory refresh function and for generating both the $\overline{RAS}$ strobe signal and a column address strobe $\overline{CAS}$ signal for normal external memory read/write operation. Generating means 14 is comprises of a pair of D-type flip-flop logic elements 16 and 18. The set S inputs and the clear CLR inputs of both flip-flops 16 and 18 are connected to a source of positive operating potential +V, to prevent a low logic level from ever appearing at these inputs. The data D input of first flip-flop 16 receives an external address latch enable strobe ALE signal (see FIG. 2b) from the appropriate terminal of microprocessor 11. The clock C inputs of both flip-flops 16 and 18 are connected in parallel to receive an the oscillator XTAL 2 output signal (see FIG. 2a) from the microprocessor. The Q output of first flip-flop 16 provides a delayed external address latch enable strobe DALE signal (see FIG. 2c) to the data D input of the second flip-flop 18. The $\overline{Q}$ output of flip-flop 16 provides a multiplexer enable MUXEN signal (see FIG. 2d) while the Q output of second flip-flop 18 provides the column address strobe $\overline{CAS}$ signal (see FIG. 2e) to dynamic memory 12. The row address strobe $\overline{RAS}$ signal to dynamic memory 12 is provided from the ALE signal driving the data D input of first flip-flop 16.

Circuit 10 also includes an address line multiplexing means 20, for controllably connecting a selected one of the 8-bit-wide microprocessor ports P0 or P2 to the 8-bit-wide dynamic memory address lines A0–A7 port. In the illustrated example, using an 8051 microprocessor having 16 address lines arranged in a pair of 8-bit-wide ports and with a dynamic RAM memory 12 comprised of eight 64K bit integrated circuits, having like addressing functional terminals wired in parallel, an 8-bit-by-2 multiplexing function is required for means 20. Accordingly, first and second 4×2 multiplexing means 22a and 22b are provided. Each multiplexer 22, which may be provided by a standard 74LS257 and the like integrated circuit, controllably connects each line of a pair of parallelled 4-bit inputs to an associated one of 4 parallelled outputs, responsive to the logic state at a select S input. Thus, in first multiplexing section 22a, each one of a set of 4 parallelled input terminals 1A–4A are individually connected to an associated one of 4 parallelled output terminals 1Y–4Y responsive to a logic 0 level at the select S input, and each one of the 4 parallelled input terminals 1B–4B is connected to the associated one of output terminals 1Y–4Y for a high logic level at the select S input. Similarly, second multiplexer section 22b connects the associated one of input terminals 1A'–4A' to the associated one of the 4 output terminals 1Y'–4Y' for a low level at the select S input and connects one of the 1B'–4B' inputs to the associated one of the 1Y'–4Y' output terminals for a high logic level input at the select S terminal. The 1Y–4Y terminals are each respectively wired to the associated one of the A0–A3 parallelled inputs of the dynamic RAM memory 12, while the 1Y'–4Y' terminals are each respectively wired to the associated one of the dynamic RAM memory parallelled input terminals A4–A7. Each multiplexer integrated circuit 22a and 22b is of the 3-output-state type, and has an output-enabling G input which disables outputs 1Y–4Y and 1Y'–4Y' to the high impedance state if held at a logic 1 level, and enables the Y or Y' outputs to the logic-active condition if held at a low logic level condition; the parallelled G inputs of multiplexer portions 22a and 22b are, in this first embodiment, connected to a low logic level (common ground potential) directly, or by means of a ground jumper $J_1$ (as illustrated).

Referring now to FIGS. 1, 2a–2h and 3, in operation, the microprocessor 11 provides an ALE pulse 30 (FIG. 2b) at the beginning of every machine cycle; the leading edge 30a and falling edge 30b of the ALE signal are related to specific cycles of the internally-generated clock pulses 32 (FIG. 2a) which are themselves controlled by a timing (crystal) element and illustratively occur at a 12 MHz. rate. The DALE signal (FIG. 2c) normally rests at a logic 0 level and rises to a logic 1 level DALE pulse 34 only if the ALE signal is at a logic 1 level when a rising edge 32a of an XTAL 2 pulse occurs, and reverts to the logic 0 level when a rising edge 32b occurs with the ALE signal returned to the logic 0 level. The MUXEN signal pulse 36 (FIG. 2d), being provided at the $\overline{Q}$ output of the same flip-flop which provides the DALE signal at the Q output thereof, is the inversion of the DALE signal pulse 34. The $\overline{CAS}$ signal (FIG. 2e) is normally at a logic 0 level and appears as a logic 1 pulse 38 having a rising edge 38a commencing at the first rising XTAL 2 pulse edge 32a' with a logic 1 DALE pulse 34 (itself occurring responsive to a previous rising edge 32a of a clock pulse). The column address strobe pulse 38 has a falling edge 38b provided responsive to the rising edge 32b' of a clock pulse occurring after the DALE signal has reverted to the logic 0 level, which itself occurs responsive to a previous clock pulse rising edge 32b.

Figure 2F:
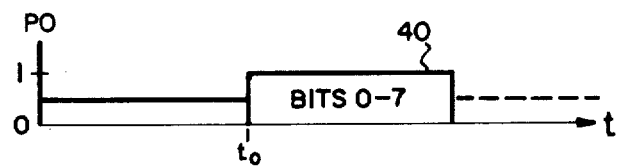
Figure 2G:
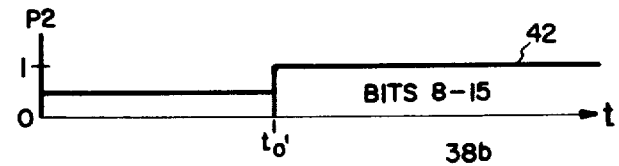
Figure 2H:
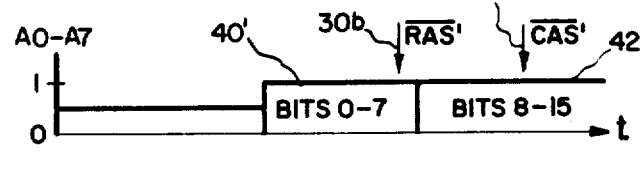

The dynamic memory accepts an 8-bit row address, present at inputs A0–A7, responsive to the falling edge 30b of the ALE signal, which falling edge is labeled $\overline{RAS}'$, and then accepts a new 8-bit column address subsequently made present at the same inputs A0–A7, responsive to the fallling edge 38b (herein labeled $\overline{CAS}'$) occurring thereafter. Thus, the microprocessor address-/data port P0 may present any data up until a time $t_0$, when the lower 8 bits of the external memory address (e.g. the row address) is provided and held stable at this port (FIG. 2f). The ALE signal causes the MUXEN logic 0 pulse 36 to be generated and multiplexer means 20 connects the A/A' inputs to the Y/Y' outputs thereof and thence to the dynamic RAM input terminals A0–A7. While the low-byte (row) address bits are connected to the RAM inputs, falling edge 30b occurs at time $t_1$, generating the $\overline{RAS}'$ strobe and causing the low-byte address bits to be accepted by the memory. Thereafter, the MUXEN pulse 36 is completed at time $t_2$ and the MUXEN line returns to the logic 1 level, connecting the B/B' multiplexer inputs to the Y/Y' outputs and the RAM memory inputs A0–A7; thus, the high-byte data from port P2 (made available thereat at some later time $t_0'$) is made available at the RAM inputs at a time $t_2$ after the $\overline{RAS}'$ falling edge time $t_1$. Thereafter, the $\overline{CAS}$ pulse 38 returns to the logic 0 level, at time $t_3$, and falling edge 38b generates the $\overline{CAS}'$ strobe entering the high-byte (column) data into the memory. By this process, any one of the 65,536 bytes of memory can be addressed (e.g. responsive to an "address" instruction in program memory 11') for normal operation of external memory 12 with microprocessor 11.

As previously mentioned, if one location on each of the memory rows was accessed within the refresh interval (e.g. about 2 milliseconds) during normal operation, no external memory 12 refresh would be needed. Since this cannot be guaranteed to occur, a separate refresh of all rows is required. In the dynamic RAM integrated circuits utilized, the memory is sectioned into four quadrants, whereby only 128 separate rows require refresh. Refresh is accomplished by issuing a "read" instruction for each of the 128 row locations within each 2 millisecond refresh cycle, to refresh the internal cell charge and maintain the internal data states in a valid condition. In actuality, it does not matter which cell element on a row is requested to be "read" and the data read from a row cell is not actually utilized; this allows a "dummy read" operation to sequentially occur for each of the 128 rows, representing all combinations of the logic states at input terminals A0–A6, (with the logic state of input terminal A7 being a "don't care" condition), to refresh the entire memory.

Because a "dummy read" operation is being used in this embodiment, it is necessary, at the same time that the external dynamic RAM memory 12 is being refreshed, that any data temporarily present in accumulator register 11a or first R0 register 11c must be stored in the stack area of the microprocessor internal RAM, to prevent destruction of this data. Further, the timer register 11d must be reset and counting of a new refresh time interval started at the commencement of each refresh cycle, to assure that the timer will overflow, interrupt the microprocessor and start the next refresh cycle with proper timing. The sequence of events is illustrated in FIG. 3 (and a program routine showing internal RAM memory 11' location, object code and source code therefor, is shown in Appendix 1 at the end of this specification).

The actual refresh sequence (using instructions prestored in program memory 11') begins at stage A (step 11 of the program) with an interrupt provided by a "short jump" SJMP instruction. Having interrupted the normal operation of microprocessor 11, timer register 11d is reestablished in stage B, by first turning off the timer register (program step 21) and then sequentially loading the least significant byte and most significant byte of the timer data therein (program steps 22 and 23), before turning on the timer in program step 24. The timer register 11d is loaded with a hexadecimal number (e.g. 0F894H) which is calculated based upon the refresh cycle timing (e.g. 2 milliseconds) required and the microprocessor clock rate (e.g. 12 MHz.) and allows for a worse case interrupt latency time (e.g. 86 microseconds) and some overhead in the establishment thereof. For the 8051 microprocessor illustrated, this time was chosen to be about 1900 microseconds. The actual starting value loaded into the timer is that value which will cause the (16-bit) timing register to overflow at the required time (1900 microseconds) after the timer is turned on.

After reestablishing the timer, stage C is entered and the contents of the accumulator A register 11a and the first temporary R0 register 11c are saved; the accumulator contents are pushed onto the stack registers in program step 26, the register R0 contents is then exchanged into the accumulator A register in program step 27, and the new contents of the accumulator register (which is the former contents of register R0) is subsequently pushed onto the stack and saved in program step 28. The microprocessor is now instructed to perform 128 row access "dummy read" operations; this burst reading of 128 rows occurs in stage D. This is accomplished by moving the hexadecimal number 07FH into register R0, to initialize that register, and then reading the external RAM data, by use of $\overline{RAS}'$ and the address multiplexer 20, at the row location indicated in the R0 register (program step 31). Thereafter, the contents of the R0 register is compared to zero, and if the R0 register number is greater than zero, this number is decremented by one (in program step 32) and the decremented number now in register R0 is again utilized to perform the "dummy read" operation at the new decremented row address. Thus, the "dummy read" operation loops around with consecutive decrementation of the row address in register R0, for all 128 combinations, until the row address in register R0 is the hexadecimal number 000. At this point, program instruction 32 finds that the R0 register contents is equal to zero and does not jump back to program step 31, but continues to program step 34. At this point, program stage E occurs and the accumulator and register R0 contents are restored from the stack, by first popping the first byte of information off the stack into the accumulator (program instruction 34), then exchanging the accumulator contents into register R0 (from which this first temporarily-stored byte of information came) and then popping the next stack-stored byte into the accumulator (program instruction 37). The microprocessor accumulator and register R0 data is now restored to the same condition as before the refresh interrupt, whereby program stage F occurs and the microprocessor interrupts are again enabled (program step 38) and the machine returns to its original processing function, whereby the refresh sequence ends. Thus, dynamic memory controller circuit 10 interfaces microcomputer 11 with dynamic RAM memory 12 for cyclic burst refresh operation of the latter, as well as normal data read/write operations therebetween.

The foregoing operational sequence with the illustrated embodiment utilizes approximately 28 percent of the available processing time of the 8051 microprocessor. A somewhat lower refresh overhead, reduced to about 21 percent of the microprocessor availablity, is possible by utilization, at steps 30–32, of the instruction sequence, in program memory 11', of: MOV R0, #0; REPEAT (128) (MOVX A, R0; INC R0). This sequence reads the data at a row memory location which is incremented from the zero-th row to the 127th row, thus encompassing all 128 rows which require refreshment.

In a second presently-preferred embodiment, significantly increased performance is provided by adding a sequential addressing means 45 (as shown in FIG. 1). Sequential row addressing means 45 includes an 8-bit binary counter 47 and an 8-bit buffer means 49. Counter 47, which may be a dual 4-bit counter integrated circuit such as the standard 74LS393 and the like, has a clear CLR input connected to the BIT 1 line of the P1 port of the microprocessor. A first 4-stage-counter clock C1 input receives the column address strobe $\overline{CAS}$ signal from the Q output of flip-flop 18. The fourth stage output of the first counter, i.e. output Q1D, is connected to the second 4-stage-counter clock C2 input. The 8-bit unidirectional buffer 49 is an octal 3-state buffer integrated circuit such as the standard 74LS244 and the like, with the gate $\overline{G}$ output enabling input connected to the counter clear CLR input. Each of the 8 counter stage outputs Q1A–Q1D and Q2A–Q2D are individually connected to the input of an associated one of the 8 buffer stages, with the output of that buffer stage being connected, in a wire-OR'd configuration, with the associated multiplexer 22 output 1Y–4Y and 1Y'–4Y' and the associated dynamic RAM memory address input A0–A7. The output control G inputs of the multiplexer stages 22a and 22b are connected, as shown by the broken-line position of jumper J1', to the BIT 0 line of port P1 of microprocessor 11. The interrupt $\overline{INT}$ input for the microprocessor is connected through a jumper J2 to the appropriate one of the last, or next-to-last, stage output of counter 47; the appropriate connection is determined by the direction of the signal waveform edge required for causing an interrupt in the particular microprocessor 11. For the illustrated 8051, requiring a falling edge, the jumper J2 is wired, as shown, to the next-to-last stage output Q2C of counter 47. This output falls after the initially-cleared counter 47 has counted 128 repetitions of the column address strobe $\overline{CAS}$ signal.

Referring now to FIGS. 1, 4a–4h and 5, the refresh sequence begins responsive to a determination (by an overflow-interrupt of microprocessor timer register 11d) that the external dynamic RAM memory 12 requires refresh, which occurs in stage A of the refresh sequence (FIG. 5). The program instructions stored in program memory 11' (and given in attachment 2 at the end of the specification) first executes a "short jump" SJMP instruction (program step 12), similar to the procedure in stage A of the routine of FIG. 3 for the first embodiment. Program stage B, similar to the same program stage B of the routine of FIG. 3, is now entered and, in program steps 16–19, the timing register 11d of the mircroprocessor is reestablished and turned on, to assure that the next refresh cycle is properly timed. Thereafter, a new stage G is entered, in which the dynamic RAM memory address multiplexer 20 is disabled and, thereafter, in stage H counter 47 is cleared and buffer 49 is enabled. For stage G, multiplexer 20 is cleared in program step 21 by setting the BIT 0 output of port P1 (i.e. the P1.0 signal) to a logic 1 level, as shown in portion 50 of FIG. 4b. The logic 1 level is provided to the output control G inputs of multiplexer portions 22a and 22b, causing the multiplexer outputs 1Y–4Y and 1Y'–4Y' to assume the high-impedance state and appear to be disconnected from the memory address inputs A0–A7. Program step 22 clears the BIT 1 line of port P1, to a logic 0 state, as shown in portion 52 of signal P1.1 in FIG. 4a. Immediately prior to this time $t_a$, the BIT 1, port 1 line P1-1 was at a logic 1 level, maintaining counter 47 in the cleared condition and disabling buffers 49. At time $t_a$, the clearing function is released and counter 47 and buffers 49 are enabled to provide the 8 bits of low logic level counter output to the associated 8 external memory address inputs A0-A7. The zero-th row of the dynamic memory is refreshed responsive to the 8 low-level logic bits being present at the memory address inputs when the $\overline{RAS}$ waveform 54 has a next falling edge 54a, which provides the $\overline{RAS}'$ strobe. Falling edge 54a also starts stage I, in which 128 counts, of counter 47, occur responsive to each column address strobe $\overline{CAS}$ signal waveform 56 falling edge 56a. This falling edge 56a is the $\overline{CAS}'$ edge that appears at counter clock C1 and advances the counter state, thus sequentially advancing the row addresses, from 0 to 127 (for the total 128 rows) and refreshing the entire memory. It will be seen that means 14 assures that the row data entered by the $\overline{RAS}'$ falling edge 54a, 54b, 54c, etc. occurs before the $\overline{CAS}'$ falling edge 56a, 56b, etc., which advances the counter 47 to the next row data count. Thus, after the zero-th row has been cleared by the first $\overline{RAS}'$ falling edge 54a, the counter is advanced to the binary 1 (e.g. 00000001) count responsive to $\overline{CAS}'$ falling edge 56a, as shown, in part, by the resulting change in the Q1A counter stage output (FIG. 4e), with the remaining stage outputs remaining at a logic 0 level (in FIGS. 4f–4h). The next $\overline{RAS}'$ edge 54b causes the row 1 cells to be refreshed, before the next $\overline{CAS}'$ falling edge 56b advances the counter to the binary 2 count. The memory row 2 is refreshed by falling edge 54c, before edge 56c advances the counter to the binary 3 count. The counter continues to count as each row is refreshed, until the counter has a binary 127 count therein. When this count is present, the $\overline{RAS}'$ falling edge 54n refreshes the last (128th) row of the memory. Thereafter, the $\overline{CAS}'$ falling edge 56n occurs and starts to set the counter to the binary 128 state, wherein only the Q2D output stages at a binary 1 level and all other stages fall from the logic 1 level, as at portion 58 of FIG. 4h, to the binary 0 level, as at portion 58a in the same Figure. Since no further rows remain to be refreshed, the falling edge 58b from the 7th stage Q2C output is utilized at the $\overline{INT}$ microprocessor input (which has been previously programmed to be transition-activated by a high-to-low transition) to interrupt and end the refresh pause. As previously mentioned hereinabove, if the microprocessor is such that a positive-going, rising edge is required, that edge 58b' can be obtained at the 8th stage Q2D output, at essentially the same time as the falling edge 58b appears.

Responsive to falling edge 58b, the pause stage I is interrupted (by the instruction at program step 23); stage J then causes buffer 49 to be disabled (and counter 47 to be cleared); and stage K again enables memory address multiplexer means 20, before the normal microprocessor interrupts are enabled and the microprocessor returns to whatever task was being done before the memory refresh activity began. It should be noted that this embodiment does not require any of the registers, either accumulator registor 11a or the R0 register 11c, to have the contents thereof temporarily pushed onto a stack, as the register contents are not affected. The buffer 49 disable/counter 47 clear stage J is carried out by program steps 24 and 25, wherein the port 1, BIT 1 line (P1.1) is set to a logic 1 level, as at portion 52a of FIG. 4a, changing the buffer 49 outputs to the high-impedance state and placing a resetting-clear logic 1 level on the clear input of counter 47. Immediately thereafter, the BIT 0 line of port P1 (P1.0) is cleared to the logic 0 state, as shown by portion 50a of FIG. 4b, to remove the high-impedance state at the multiplexer outputs 1Y–4Y and 1Y'–4Y', and allow normal low and high logic levels to be present thereat, dependent upon the state of the respective multiplexer inputs. The routine ends with an interrupt-enabling return program step 27. This counter-controlled memory refresh circuit typically requires only about 4 percent of the microprocessor 8051 availability, allowing less interruption of normal program execution.

While several presently preferred embodiments of my novel controller for dynamic RAM memory external to a single-chip microprocessor have been described with detail herein, many variations and modifications will now become apparent to those skilled in the art. For example, even further program time can be saved, since the port 1, bit 0 and bit 1 signals are complements of one another, if an inverter is used between the counter 47 clear CLR input/buffer 47 enable $\overline{G}$ line and the multiplexer 20 output-disable G line to operate the second embodiment responsive to the state of a single binary signal from a single-bit output line of the approximate port (e.g. port 1) of the microprocessor means. It is my intent, therefore, to be limited only by the scope of the appending claims and not by the specific details and instrumentalities presented by way of explanation herein.

ATTACHMENT 1

| LOC | OBJECT | LN | SOURCE | | |
|-----|--------|----|--------|----|----|
|     |        | 01 | ; DYNAMIC MEMORY REFRESH TIMING AND BURST REFRESH | | |
|     |        | 02 | ; AUTHORED BY: Michael Gdula, GE, CRD, Bldg. K1-2S17 | | |
|     |        | 03 | ; COPYRIGHT 1983 GE COMPANY | | |
|     |        | 04 | ; | | |
|     |        | 05 | NAME | RAMRTC | |
|     |        | 06 | PUBLIC | RAMRTC, | BEGIN; |
|     |        | 07 |        |         |        |
| —   |        | 08 | CSEG   |         |        |
|     |        | 09 |        |         |        |
| 001B |       | 10 | -ORG   | 01BH    |        |
| 001B | 8033  | 11 |        | SJMP    | BEGIN; |
|     |        | 12 | ;      |         |        |
|     | F894   | 13 | REF-CON | EQU    | 0F894H; ASSUME 12 MHz CLOCK |
|     |        | 14 | ;      | ;       | AND 2 MILLISECOND REFRESH |
|     |        | 15 | ;      | ;       | MINUS 86 MICROSECOND WORST |
|     |        | 16 | ;      | ;       | CASE INTERRUPT LATENCY AND |
|     |        | 17 | ;      | ;       | ALLOW FOR SOME OVERHEAD THUS |
|     |        | 18 | ;      | ;       | 1900 MICROSECONDS (8051) |
| 0050 |       | 19 | ORG    | 050H    | ;      |
|     |        | 20 |        |         |        |

ATTACHMENT 1

| LOC | OBJECT | LN | SOURCE | | | |
|---|---|---|---|---|---|---|
| 0050 | C28E | 21 | BEGIN: | CLR | TR1; | TURN OFF THE TIMER |
| 0052 | 758B94 | 22 | | MOV | # (LOW REF-CON); | LSB OF REFRESH TIMER |
| 0055 | 758DF8 | 23 | | MOV | TH1, # (HIGH REF-CON); | MSB OF REFRESH TIMER |
| 0058 | O28E | 24 | | SETB | tr1; | TURN ON THE TIMER |
| | | 25 | ; | | | |
| 005A | COE0 | 26 | | PUSH | ACC; | SAVE THIS |
| 005C | C8 | 27 | | XCH | A,RO; | SWAP REGISTERS |
| 005D | COE0 | 28 | | PUSH | ACC; | SAVE RO |
| | | 29 | ; | | | |
| 005F | 787F | 30 | | MOV | RO,#07FH; | 128 RAS ITERATIONS |
| 0061 | E2 | 31 | BEGI2: | MOVX | A,@RO; | DUMMY READ |
| 0062 | D8FO | 32 | | DJNZ | RO,BEGI2; | LOOP TILL DONE |
| | | 33 | | | | |
| 0064 | D0E0 | 34 | | POP | ACC; | GET BACK RO |
| 0066 | C8 | 35 | | XCH | A,RO; | AND PUT IT THERE |
| 0067 | DoE0 | 36 | | POP | ACC; | GET THE ACCUMULATOR |
| | | 37 | | | | |
| 0069 | 32 | 38 | | RETI | : | GO HOME |
| | | 39 | | | | |
| | | 40 | | END | | |

ATTACHMENT 2

| LOC | OBJECT | LN | SOURCE | | | |
|---|---|---|---|---|---|---|
| | | 01 | ; DYNAMIC MEMORY REFRESH | | | |
| | | 02 | ; AUTHORED BY: Michael Gdula, GE, CRD, Bldg, K1-2S17 | | | |
| | | 03 | ; COPYRIGHT 1983 GE COMPANY | | | |
| | | 04 | ; | | | |
| | | 05 | NAME | RAMADR | | |
| | | 06 | PUBLIC RAMADR, BEGIN, PAUSE; | | | |
| | | 07 | | | | |
| | | 08 | CSEG | | | |
| 001B | | 09 | ORG | 01BH | ; | |
| 001B | 8033 | 10 | | SJMP | BEGIN; | |
| | | 11 | ; | | | |
| | F894 | 12 | REF-CON | EQU | OF898H; | |
| | | 13 | ; | | | |
| 0050 | | 14 | ORG | 050H | ; | |
| | | 15 | | | | |
| 0050 | C28E | 16 | BEGIN: | CLR | TR1; | TURN OFF THE TIMER |
| 0052 | 758B94 | 17 | | MOV | TL1, # (LOW REF-CON); | LSB OF REFRESH TIMER |
| 0055 | 758DF8 | 18 | | MOV | TH1, # (HIGH REF-CON); | MSB OF REFRESH TIMER |
| 0058 | D28E | 19 | | SETB | TR1; | TURN ON THE TIMER |
| | | 20 | ; | | | |
| 005A | D290 | 21 | | SETB | P1.0; | |
| 005C | C291 | 22 | | CLR | P1.1; | |
| 005E | 30B3FD | 23 | PAUSE: | JNB | INT1,PAUSE; | |
| 0061 | D291 | 24 | | SETB | P1.1; | |
| 0063 | C290 | 25 | | CLR | P1.0; | |
| | | 26 | | | | |
| 0065 | 32 | 27 | | RETI | ; | GO HOME |
| | | 28 | | | | |

What is claimed is:

1. In combination, dynamic memory means for storing one bit of each of a plurality of data words in each cell along one of a plurality of rows each containing a multiplicity of said cells, said dynamic memory means requiring periodic refreshment, within a maximum time interval, of at least one cell along each of said rows, and including a plurality N of address inputs for designating at least the row of said memory means to be addressed;

single-chip microprocessor means internally containing at least a cpu and an internal memory, for utilization of the data stored into said dynamic memory means, which is external to said microprocessor means, and including means for providing a periodic clock signal timing means for causing a refresh sequence for the external memory means to be initiated at a time not longer than the maximum time interval after a previous refreah sequence has been initiated; means for periodically providing a single external memory enable signal during each of a sequential multiplicity of operational cycles of said miroprocessor means; at least two output ports of N bit-lines each; and refresh-addressing means for presenting a refresh row designation data to at least one designated one of said output ports responsive to an initiation of a refresh sequence by said timing means; and address means, activated directly and solely by said clock signal and said single external memory enable signal and responsive to said timing means initiating said refresh sequence, for sequentially addressing at least one cell along each of said plurality of memory means rows to refresh the information stored in all cells along that memory row having the cell then being addressed; said address means including: multiplexing means for selectively connecting each of the N bit-lines of said at least one designated one of the microprocessor means output ports to the associated one of the row-designating N inputs of said dynamic memory means, with the designation of the one output port of said microprocessor means then connected being responsive to different states of a selection signal; and logic means for providing the selection signal state responsive only to receipt of both said clock signal and said external memory enable signal from said microprocessor means, including a first flip-flop logic element having a clock input receiving said clock signal, a data input receiving said external memory enable signal, and an output providing said selection signal and having an output state determined by both the state of the data input signal and the occurrence of a first pulse of said clock signal exit clock input; and said memory means accepts thr ow designation data at said address inputs responsive to a row-address strobe signal generated by a change in said external memory enable signal prior to another pulse of said clock signal, occurring after said first clock signal pulse.

2. The combination of claim 1, wherein said logic means further includes a second flip-flop logic element having a clock input receiving said clock signal, a data input receiving the inversion of said selection signal from the output of said first flip-flop logic element, and an output providing a column-address strobe signal responsive to the state of said data input when an additional pulse of said clock signal occurs at said second flip-flop logic element clock input at a selected time after the occurrence of said another clock signal pulse.

3. The combination of claim 2, wherein said memory means is adapted to allow selection of data stored in one cell along a previously-selected one of said plurality of rows responsive to a plurality of data bits presented at said plurality N of memory means address inputs when said column-address strobe signal is received; said microprocessor means is adapted to provide, prior to the occurrence of said column-address strobe signal, column designation data at another of the at least two output ports; and said first flip-flop logic element output changes the state of the selection signal prior to said additional clock signal pulse, to cause said multiplexing means to connect each of the N bit-lines of the another output port to the associated one of the plurality N of memory means addressing inputs prior to reception of the column-address strobe signal.

4. In combination, dynamic memory means for storing one bit of each of a plurality of data words in each cell along one of a plurality of rows each containing a multiplicity of said cells, said dynamic memory means requiring periodic refreshment, within a maximum time interval, of at least one cell along each of said rows; and including a plurality N or address inputs for receiving data, responsive to a row-address strobe signal, for designating at least the row of said memory means to be addressed;

single-chip microprocessor means internally containing at least a CPU and an internal memory, for utilization of the data stored in said dynamic memory means, which is external to said microprocessor means, and including means for providing a periodic clock signal; timing means for causing a refresh sequence for the external memory means to be initiated at a time not longer than the maximum time interval after a previous refresh sequence has been initiated; means for periodically providing a single external memory enable signal during each of a sequential multiplicity of operational cycles of said microprocessor means; and means for providing a clearing signal which is normally enabled and is temporarily disabled, for the duration of a refresh sequence, responsive to said timing means determining that a refresh sequence is required; and address means, activated directly and solely by said clock signal and said single external memory enable signal and responsive to said timing means initiating said refresh sequence, for sequentially addressing at least one cell along each of said plurality of memory means rows to refresh the information stored in all cells along that memory row having the cell then being addressed, and including: a first flip-flip logic element having a clock input receiving said clock signal, a data input receiving said external memory enable signal, and an output having an output state determined by both the state of the data input signal and occurrence of a first pulse of said clock signal at said clock input; means for generating said row-address strobe signal responsive to a change in said external memory enable signal prior to another pulse of said clock signal, occurring after said first clock signal pulse; a second flip-flop logic element having a clock input receiving said closk signal, a data input receiving the inversion of the output signal of said first flip-flop logic element, and an output providing a column-address strobe signal responsive to the state of said data input when a different pulse of said clock signal occurs at said second flip-flop logic element clock input at a selected time after the occurrence of said another clock signal pulse; counter means for sequentially counting, with one count change being responsive to each occurrence of said column-address strobe signal, through a plurality of different ouput states, equal at least to the number of the plurality of row addresses, said counter means being cleared to a lowest count responsive to the enablement of said clearing signal and enabled to count responsive to the disablement of said clearing signal; and means for providing the output count of said counter means to the plurality of memory means address inputs for designating the row of said memory means to be addressed.

5. The combination of claim 4, wherein a first of said row-address strobe signals is provided to said memory means only after said lowest count has been provided to said memory means address inputs from said counting means.

6. The combination of claim 5, wherein each subsequent row-address strobe signal is provided only after the count in said counting means has been changed, responsive to a column-address strobe signal, and the changed count has been provided to said memory means address inputs.

7. The combination of claim 4, wherein said microcomputer means is adapted to cease other operations when said counter means is enabled to count and to resume said other operations responsive to said counter means reaching a predetermined count.

8. The combination of claim 4, wherein said microprocessor means has at least two output ports of N bit lines each, and further comprising multiplexing means for selectively connecting each of the N bit-lines of only one designated one of the at least two microprocessor means output ports to the associated one of the row-designating N inputs of said dynamic memory means, with the designation of the one output port of said microprocessor means then connected being responsive to different states of a selection signal provided at the output of said first flip-flop logic element; said multiplexing means being effectively disconnected from said memory means address inputs whenever said clearing signal is disabled.

9. A controller for interfacing external dynamic memory means for storing each bit of a plurality of data words in one of a plurality of cells along each of a plurality of rows each containing a multiplicity of said cells, and having a plurality N of address input lines for designating at least the memory means row responsive to a row-address strobe signal, and a microprocessor, having a CPU and an internal memory and having at least two output ports, each containing at least a plurality N of bit-lines at which at least external memory addressing data is provided, with the microprocessor providing only a periodic clock signal and an external memory enable signal, along with said at least external memory addressing data, to said controller; said controller comprising: multiplexing means for selectively connecting each of N selected bit-lines of a designated one of the microprocessor output ports to a predetermined on of the N address inputs of the external dynamic memory means; that one of the plurality of microprocessor means output ports then being connected to said memory means being designated responsive to a selected one of a plurality of different states of a selection signal; and logic means for providing the selection signal state responsive to receipt of both said clock signal and said external memory enable signal, and including: a first flip-flop logic element having a data input receiving said external memory enable signal, a clock input receiving said clock signal and an output providing said selection signal and having each of the plurality of different states determined by both the state of the data input signal and the occurrence of a first pulse of said clock signal at said clock input, and means for providing said row-address strobe signal responsive only to a change in the external memory enable signal prior to another pulse of said clock signal occurring after said first clock signal pulse.

10. The controller of claim 9, wherein said external dynamic memory means determines the particular cell along the designated row responsive to column address data present at said plurality N of address inputs and responsive to the presence of a column-address strobe signal; said logic means further including a second flip-flop logic element having a clock input receiving said clock signal, a data input receiving the inversion of the selection signal and the output of said first flip-flop logic element, and an output providing said column-address strobe signal responsive to the state of input when an additional pulse of said clock signal occurs at said second flip-flop logic element clock input at a selected time after the occurrence of said another clock signal pulse.

11. The controller of claim 10, further comprising counter means for sequentially counting, with one count change being responsive to each occurrence of said column-address strobe signal, through a plurality of different output states, equal at least to the number of the plurality of row addresses of said external dynamic memory means, said counter means being cleared to a lowest count responsive to the enablement of a clearing signal and enabled to count responsive to the disablement of said clearing signal; said multiplexing means being enabled by said clearing signal; and means for providing the output count of said counter means to the plurality of external memory means address inputs for designating the row of said memory means to be addressed.

12. The controller of claim 11, wherein a first of said row-address strobe signals is provided to said external memory means only after said lowest count has been provided to said external memory means address inputs from said counting means.

13. The controller of claim 12, wherein each subsequent row-address strobe signal is provided only after the count in said counting means has been changed, responsive to a column-address strobe signal, and the changed count has been provided to said external memory means address inputs.

14. The controller of claim 12, wherein said microprocessor is adapted to disable said clearing signal whenever refreshment of said external memory means is required, and said controller includes means for providing a signal to said microcomputer responsive to said counter means reaching a predetermined count.

15. The controller of claim 14, wherein said microprocessor is adapted to enable said clearing signal when said predetermined count signal is received.

* * * * *